United States Patent
Knotter et al.

(10) Patent No.: US 6,887,796 B2
(45) Date of Patent: May 3, 2005

(54) METHOD OF WET ETCHING A SILICON AND NITROGEN CONTAINING MATERIAL

(75) Inventors: Dirk Maarten Knotter, Nijmegen (NL); Johannes Van Wingerden, Eindhoven (NL); Madelon Gertruda Josephina Rovers, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/475,874

(22) PCT Filed: Apr. 18, 2002

(86) PCT No.: PCT/IB02/01412

§ 371 (c)(1),
(2), (4) Date: Oct. 24, 2003

(87) PCT Pub. No.: WO02/089193

PCT Pub. Date: Nov. 7, 2002

(65) Prior Publication Data

US 2004/0121600 A1 Jun. 24, 2004

(30) Foreign Application Priority Data

Apr. 27, 2001 (EP) .......................................... 01201595

(51) Int. Cl.$^7$ .............................................. H01L 21/461
(52) U.S. Cl. ............................... 438/757; 257/E21.228; 257/E21.251; 257/E21.49
(58) Field of Search .................. 438/757; 257/E21.228, 257/E21.251, 21.49

(56) References Cited

U.S. PATENT DOCUMENTS 6,333,547 B1 * 12/2001 Tanaka et al. .............. 257/649
2003/0087179 A1 * 5/2003 Iwasaki ...................... 430/166

* cited by examiner

Primary Examiner—George Fourson
Assistant Examiner—Thanh V Pham
(74) Attorney, Agent, or Firm—Peter Zawilski

(57) ABSTRACT

The invention relates to a method of manufacturing a semiconductor device comprising the step of removing a silicon and nitrogen containing material by means of wet etching with an aqueous solution comprising hydrofluoric acid in a low concentration, the aqueous solution being applied under elevated pressure to reach a temperature above 100° C.

10 Claims, 1 Drawing Sheet

METHOD OF WET ETCHING A SILICON AND NITROGEN CONTAINING MATERIAL

Figure 1:
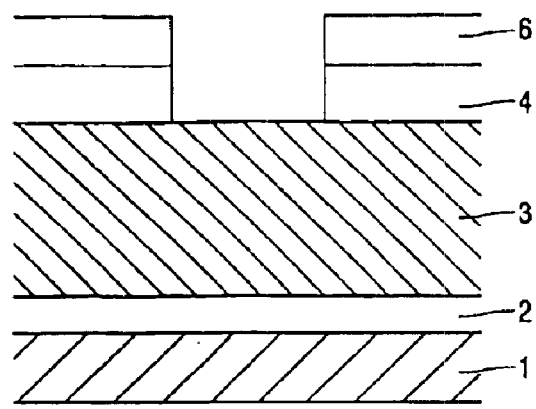

The invention relates to a method of manufacturing a semiconductor device comprising the step of removing a silicon and nitrogen containing material by means of wet etching.

Silicon and nitrogen containing materials, such as silicon nitride and silicon oxynitride, are frequently used in the manufacture of integrated circuits. One application of such a material consists in using it as a bottom antireflective coating (BARC) to better control the critical dimension (CD) of the gate as defined via a resist mask formed thereon. The wafer stack may comprise a gate oxide layer over a semiconductor substrate, a polysilicon layer over the gate oxide layer, a BARC over the conductive layer, and a resist mask over the BARC. The wafer stack is then shaped to form one or more polysilicon gates by sequentially etching through selected portions of the BARC and the gate conductive layer as defined by the etch windows in the resist mask. Once properly shaped, the remaining portions of the resist mask and BARC are removed. During removal of the BARC by means of wet etching the sidewalls of the polysilicon gate(s) as well as the non-covered portions of the gate oxide layer are exposed to the etch mixture used for wet etching the BARC. Another application of such a material consists in using it as mask in the so-called shallow trench isolation (STI) process, wherein during removal of this mask by means of wet etching the field oxide regions are exposed to the etch mixture applied. It will be clear to a person skilled in the art of manufacturing processes for integrated circuits that the application of silicon and nitrogen containing materials, such as silicon nitride and silicon oxynitride, is not limited to the above-indicated examples, but that many other applications exist.

Wet etching of such a material is often carried out in hot phosphoric acid at a high operational temperature, usually a temperature between 140° C. and 180° C., which etching process enables a high selectivity with respect to silicon oxide and silicon oxide like materials. By this high selectivity is meant that the silicon and nitrogen containing material is etched at a rate significantly greater than that of silicon oxide or a silicon oxide like material. However, several problems are coupled to this etching process: 1) an organic photoresist is not resistant to the high temperatures and is removed during the etching process, 2) the etching process is prone to particle contamination, 3) the selectivity to exposed polylines is poor, 4) the selectivity to exposed silicon oxide or an exposed silicon oxide like material is dependent on the age of the bath; the selectivity of a fresh bath can be considerably lower than the selectivity of an old bath, 5) the process time needed for etching is quite long which makes the etching process suitable for multi-wafer processes only, that is processes wherein multiple wafers are simultaneously processed in one and the same process chamber.

An alternative is to wet etch a silicon and nitrogen containing material, such as silicon nitride or silicon oxynitride, in a dilute aqueous hydrofluoric acid (HF) solution having a hydrofluoric acid concentration in the range from about 0.001 M to about 0.1 M at an operational temperature between 25° C. and 90° C. Most of the problems coupled to the etching process with hot phosphoric acid are solved by using a dilute aqueous hydrofluoric acid solution in the above temperature range. However, one important problem still remains. The temperature and the hydrofluoric acid concentration cannot be tuned in the above-indicated ranges so that the etch rate becomes high enough for the etching process to be efficiently carried out by means of a single-wafer process without negatively affecting the etch selectivity with respect to silicon oxide or a silicon oxide like material.

The invention has inter alia for its object to provide a method of the kind mentioned in the opening paragraph, in which method the performance of the step of removing the silicon and nitrogen containing material by means of wet etching is improved.

The step of removing the silicon and nitrogen containing material by means of wet etching of the method according to the invention is for this purpose carried out with an aqueous solution comprising hydrofluoric acid in a low concentration, the aqueous solution being applied under elevated pressure to reach a temperature above 100° C. By applying the aqueous solution at elevated pressure the temperature of the aqueous solution can be raised to above 100° C., which increases the etch rate in such a way that the etching process can be carried out fast enough by means of a single-wafer process. In addition, a temperature of above 100° C. does not negatively affect the etch selectivity with respect to silicon oxide or a silicon oxide like material. On the contrary, this etch selectivity is even increased.

The process of etching the silicon and nitrogen containing material can be carried out by means of a multi-wafer process in e.g. a spray tool or a wet bench. A multi-wafer process is a process, in which multiple wafers are simultaneously processed in one and the same process chamber. However, as the method according to the invention enables etch rates that are significantly higher than that of prior art methods, the process of etching the silicon and nitrogen containing material can also be advantageously carried out by means of a single-wafer process, i.e. a process in which just one wafer is processed in one and the same process chamber at a time.

Further advantageous embodiments of the method in accordance with the invention are described in the dependent claims.

The invention further relates to an apparatus for carrying out the step of removing a silicon and nitrogen containing material by means of etching with an aqueous solution comprising hydrofluoric acid in a low concentration, the aqueous solution being applied under elevated pressure to reach a temperature above 100° C.

These and other aspects of the invention will be explained in more detail with reference to the drawing, in which FIGS. 1 to 4 show in diagrammatic cross-sectional views successive stages in the manufacture of a semiconductor device using the method in accordance with the invention.

Figure 2:
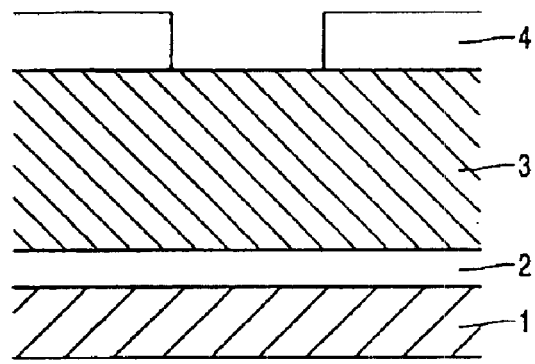

FIG. 1 shows a substrate 1, which consists of a semiconductor body, for example a silicon body, provided with a layer of a dielectric material 2 as uppermost layer. It will be clear to a person skilled in the art that, dependent on the stage of the manufacturing process, the substrate 1 can consist of other layers and structures in addition. On the layer of dielectric material 2 there is a layer of silicon 3. The layer of silicon 3, which in the present example is applied as a gate layer, is advantageously applied as a layer of polycrystalline silicon or amorphous silicon. On the layer of silicon 3 an inorganic anti-reflective layer 4 of a silicon and nitrogen containing material is applied, which silicon and nitrogen containing material is preferably silicon nitride or silicon oxynitride, and even more preferably silicon-rich silicon nitride or silicon-rich silicon oxynitride. The layer of dielectric material 2, which is applied as gate dielectric layer in the present example, is advantageously composed of a material with respect to which the inorganic anti-reflective layer (4) of the silicon and nitrogen containing material can be selectively etched, such as silicon oxide or a silicon oxide like material. The inorganic anti-reflective layer 4 is provided with a resist mask 6. In between the inorganic anti-reflective layer 4 and the resist mask 6 another layer such as, for example, a silicon oxide layer may be present. The inorganic anti-reflective layer 4 is patterned by means of the resist mask 6 in a usual way. Then, the resist mask 6 is removed in a usual way (FIG. 2).

Figure 3:
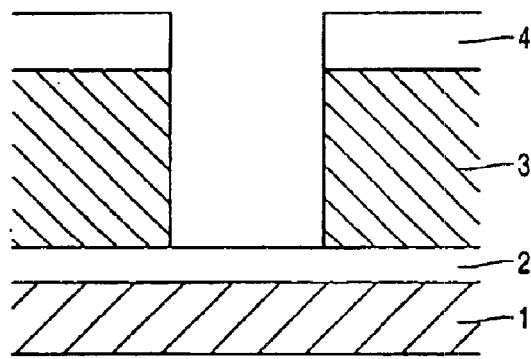

In FIG. 3, the layer of silicon 3 is patterned in a usual way down to the layer of dielectric material 2 by means of etching while using the patterned inorganic anti-reflective layer 4 as a hard mask.

Figure 4:
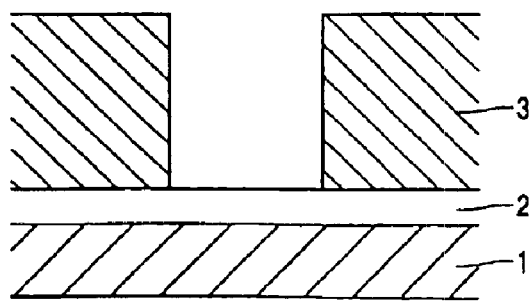

In FIG. 4, the inorganic anti-reflective layer 4 of the silicon and nitrogen containing material, such as silicon nitride or silicon oxynitride, is removed by means of etching with an aqueous solution comprising hydrofluoric acid in a low concentration, preferably a concentration in the range from about 0.001 to 0.1 M. The aqueous solution is applied at a temperature above 100° C., preferably a temperature in the range from 100° C. to 130° C. The temperature of the aqueous solution can be increased to a value above 100° C. by using the aqueous solution at elevated pressure. This can be accomplished, for example, by delivering a pressurized inert gas into the process chamber wherein etching of the inorganic anti-reflective layer of the silicon and nitrogen containing material is carried out. Another way of accomplishing the above may be by heating up the aqueous solution to the desired temperature in a closed airtight system. During this heating-up the pressure inside the closed airtight system rises which in turn causes an increase in the temperature of the aqueous solution that can be ultimately reached. A still further way may be by using a hydraulic pump.

By means of this etching process attack of the exposed sidewalls of the layer of silicon 3 is counteracted. As a result, the inorganic anti-reflective layer 4 can be removed without any important change occurring in the critical dimension (CD). Moreover, once the top wall of the layer of silicon 3 is exposed, attack of this top wall is also counteracted during the above-mentioned etching process. Furthermore, this etching process in addition has a good selectivity with respect to the layer of dielectric material 2, that is the inorganic anti-reflective layer 4 is etched at a rate significantly greater than that of the layer of dielectric material 2. The higher the temperature in the range from 100° C. to 130° C., the higher the etch rate of the inorganic anti-reflective layer 3 and the higher the etch selectivity with respect to the layer of dielectric material 2. Moreover, in order to improve the etch selectivity between the inorganic anti-reflective layer 4 and the layer of silicon 3, i.e. to reduce the etch rate of the layer of silicon 3 relative to that of the inorganic anti-reflective layer 4, it is preferred to treat the aqueous solution in such a way that the layer of silicon 3 is kept in an non-oxidized state during etching the inorganic anti-reflective layer 4. This can be accomplished by means of removal of dissolved oxygen from the aqueous solution by evacuating the aqueous solution. Another way concerns exchange of dissolved oxygen for an inert gas, such as nitrogen ($N_2$) or argon (Ar), by means of bubbling the inert gas through the aqueous solution. It will be clear to a person skilled in the art that not all dissolved oxygen needs be removed or replaced by an inert gas in order to reach a positive effect on the state of the layer of silicon 3. The effect will be larger with increasing percentage of dissolved oxygen removed from the aqueous solution or replaced by an inert gas. Besides removal or exchange of dissolved oxygen a still further method involves the addition of a reducing agent, such as dissolved hydrogen ($H_2$) or a chemical such as dithionous acid ($H_2S_2O_4$), hyposulfuric acid ($H_2S_2O_6$) or formic acid (HCOOH). Hydrogen can be dissolved in the aqueous solution by bubbling it through the aqueous solution. It will be clear to a person skilled in the art that by application of two or more of the above-mentioned treatments of the aqueous solution an even more pronounced effect on the state of the layer of silicon 3 can be reached.

Depending on the wet etching process to be carried out, the aqueous solution may be applied with one or more other additives, such as, for example, a pH modifier to control the etch rate and/or etch selectivity, a surfactant to improve the surface wetting and/or an organic solvent to control e.g. the etch selectivity. Examples of a pH modifier are $NH_4OH$, $NH_4F$, HCl, $HNO_3$ and $H_2SO_4$.

The process of etching the inorganic anti-reflective layer 4 can be carried out by means of a multi-wafer process in e.g. a spray tool or a wet bench. A multi-wafer process is a process in which multiple wafers are processed simultaneously in one and the same process chamber. However, as the method according to the invention enables etch rates that are significantly higher than that of prior art methods, the process of etching the inorganic anti-reflective layer can also be advantageously carried out by means of a single-wafer process, i.e. a process in which just one wafer is processed in one and the same process chamber at a time.

After the gates have been defined, the device may be subjected to further usual and generally known process steps for the manufacture of integrated circuits, such as the provision of source and drain zones in the semiconductor body and the provision of connections between the transistors.

It will be obvious that the invention is not limited to the example described above, but that many more variations are possible to those skilled in the art within the scope of the invention.

What is claimed is:

1. A method of manufacturing a semiconductor device comprising the step of removing a silicon and nitrogen containing material by means of wet etching with an aqueous solution comprising hydrofluoric acid in a low concentration, the aqueous solution being applied under elevated pressure to reach a temperature above 100° C.

2. A method as claimed in claim 1, wherein the silicon and nitrogen containing material is silicon nitride or silicon oxynitride.

3. A method as claimed in claim 1, wherein the silicon and nitrogen containing material is silicon-rich silicon nitride or silicon-rich silicon oxynitride.

4. A method as claimed in claim 1, wherein the silicon and nitrogen containing material is etched by means of a single-wafer process.

5. A method as claimed in claim 1, wherein the aqueous solution is applied at a temperature in the range from 100° C. to about 130° C.

6. A method as claimed claim 1, wherein the aqueous solution is treated so as to keep the layer of silicon in an non-oxidized state during etching the inorganic anti-reflective layer.

7. A method as claimed in claim 6, wherein dissolved oxygen is removed from the aqueous solution by evacuating the aqueous solution.

8. A method as claimed in claim 6, wherein dissolved oxygen is removed from the aqueous solution by exchanging it for an inert gas.

9. A method as claimed in claim 6, wherein a reducing agent is added to the aqueous solution.

10. A method as claimed in claim 1, wherein the hydrofluoric acid is applied in an concentration in the range of about 0.001 to 0.1 M.

* * * * *